(12) United States Patent
Barber et al.

(10) Patent No.: US 7,414,350 B1
(45) Date of Patent: Aug. 19, 2008

(54) ACOUSTIC MIRROR STRUCTURE FOR A BULK ACOUSTIC WAVE STRUCTURE AND METHOD FOR FABRICATING SAME

(75) Inventors: Bradley Barber, Acton, MA (US); Paul P. Gehlert, Sterling, MA (US); Sahana Kenchappa, Woburn, MA (US); Christopher F. Shepard, Nashua, NH (US)

(73) Assignee: Skyworks Solutions, Inc., Woburn, MA (US)

( * ) Notice: Subject to any disclaimer, the term of this patent is extended or adjusted under 35 U.S.C. 154(b) by 222 days.

(21) Appl. No.: 11/367,559

(22) Filed: Mar. 3, 2006

(51) Int. Cl.
*H01L 41/08* (2006.01)
(52) U.S. Cl. .................. 310/324; 310/334; 333/187
(58) Field of Classification Search ............... 310/320, 310/322, 324, 334; 333/187–189
See application file for complete search history.

(56) References Cited

U.S. PATENT DOCUMENTS

| | | | |
|---|---|---|---|
| 5,873,154 A * | 2/1999 | Ylilammi et al. ........... 29/25.35 |
| 6,204,737 B1 * | 3/2001 | Ella ........................... 333/187 |
| 6,496,085 B2 * | 12/2002 | Ella et al. ................... 333/189 |
| 6,603,241 B1 | 8/2003 | Barber et al. |
| 6,720,844 B1 * | 4/2004 | Lakin ......................... 333/189 |
| 6,933,807 B2 * | 8/2005 | Marksteiner et al. ........ 333/187 |
| 7,170,215 B2 * | 1/2007 | Namba et al. ............... 310/324 |
| 7,235,915 B2 * | 6/2007 | Nakamura et al. .......... 310/335 |
| 7,328,497 B2 * | 2/2008 | Barber et al. ................. 29/594 |

* cited by examiner

*Primary Examiner*—Mark Budd
(74) *Attorney, Agent, or Firm*—Farjami & Farjami LLP

(57) ABSTRACT

According to one embodiment of the invention, an acoustic mirror structure situated in a bulk acoustic wave structure includes a number of alternating low acoustic impedance and high acoustic impedance layers situated on a substrate. Each high acoustic impedance layer includes a first mole percent of a primary metal and a second mole percent of a secondary metal, where the first mole percent of the primary metal is greater than the second mole percent of the secondary metal, and where the secondary metal causes each high acoustic impedance layer to have increased resistivity. According to this exemplary embodiment, the second mole percent of the secondary metal can cause only a minimal decrease in density of each high acoustic impedance layer. The increased resistivity of each high acoustic impedance layer can cause a reduction in electrical loss in the bulk acoustic wave structure.

23 Claims, 3 Drawing Sheets

ACOUSTIC MIRROR STRUCTURE FOR A BULK ACOUSTIC WAVE STRUCTURE AND METHOD FOR FABRICATING SAME

BACKGROUND OF THE INVENTION

1. Field of the Invention

The present invention is generally in the field of semiconductor fabrication. More specifically, the invention is in the field of fabrication of bulk acoustic wave structures in semiconductor dies.

2. Background Art

Bulk acoustic wave structures, which can be used in frequency control or filtering applications, can include a piezoelectric layer and an acoustic mirror structure. The acoustic mirror structure, which can include a number of alternating low and high acoustic impedance layers, can be used to trap acoustic energy in the piezoelectric layer. In the acoustic mirror structure, the level of acoustic reflectivity at the interface between a low and a high acoustic impedance layer determines the number of alternating low and high acoustic impedance layers the acoustic mirror structure requires to achieve a desired level of acoustic reflectivity. By way of background, the level of acoustic reflectivity at an interface between two layers is determined by the difference in each layer's acoustic impedance. Also, a denser layer generally has higher acoustic impedance than a less dense layer. Thus, the level of reflectivity between low and high acoustic impedance layers in the acoustic mirror structure can be increased by decreasing the density of the low acoustic impedance layers and increasing the density of the high acoustic impedance layers.

In a conventional acoustic mirror structure in a bulk acoustic wave structure, silicon dioxide, which has a very low density, can be used in low acoustic impedance layers and metal, which is a readily available high density material, can be used in high acoustic impedance layers. For example, tungsten, which is easy to deposit, relatively inexpensive, and has a high density, is a typically used metal in high acoustic impedance layers in conventional acoustic mirror structures. However, high density metal such as tungsten also have relatively low resistivity, which can impose or worsen undesired RF parasitic paths detrimental to device function including stray capacitances and image currents in the high acoustic impedance layers of the acoustic mirror structure due to its close proximity to the device's signal path. These induced parasitics can cause an undesirable increase in electrical loss in the bulk acoustic wave structure. Additional loss in bulk acoustic wave structures can be caused by scattering of acoustic waves at non-smooth interfaces between the layers of the structure, and acoustic viscosity seen by the waves traveling through the layers. Each of these sources of loss can also be reduced by proper choice of composition of high acoustic impedance layers.

Although insulators such as aluminum nitride or tantalum oxide can be used in high acoustic impedance layers in conventional acoustic wave structures, these insulators generally have a much lower density than high density metals, such as tungsten. As a result, conventional acoustic wave structures that use insulators in high acoustic impedance layers typically require more additional low and high acoustic impedance layers to achieve a desired level of acoustic reflectivity, which undesirably increases manufacturing cost. It is also the case that non-optimal choices for high and low impedance layer materials will reduce the observed electromechanical coupling of the bulk acoustic wave structures and as such reduce the bandwidth of filters in which they are used.

Thus, there is a need in the art for an acoustic mirror structure for bulk acoustic wave structures, where the acoustic mirror structure includes high acoustic impedance layers comprising a high density material that does not cause increased electrical loss in the bulk acoustic wave structures.

SUMMARY OF THE INVENTION

The present invention is directed to an acoustic mirror structure for a bulk acoustic wave structure and method for fabricating same. The present invention addresses and resolves the need in the art for an acoustic mirror structures for bulk acoustic wave structures, where the acoustic mirror structures includes high acoustic impedance layers comprising high density material that does not cause increased electric loss in the bulk acoustic wave structures.

According to one embodiment of the invention, an acoustic mirror structure situated in a bulk acoustic wave structure includes a number of alternating low acoustic impedance and high acoustic impedance layers situated on a substrate. For example, the acoustic mirror structure can include two high acoustic impedance layers. Each high acoustic impedance layer includes a first mole percent of a primary metal and a second mole percent of a secondary metal, where the first mole percent of the primary metal is greater than the second mole percent of the secondary metal, and where the secondary metal causes each high acoustic impedance layer to have increased resistivity. For example, the primary metal can be tungsten and the secondary metal can be titanium. For example, the first mole percent of the primary metal can be approximately 70 mole percent and the second mole percent of the secondary metal can be approximately 30 mole percent. The secondary metal can increase the resistivity of each high acoustic impedance layer by a factor of five, for example.

According to this exemplary embodiment, the second mole percent of the secondary metal can cause only a minimal decrease in density of each high acoustic impedance layer. The increased resistivity of each high acoustic impedance layer can cause a reduction in electrical loss in the bulk acoustic wave structure. In one embodiment, the invention is a method for fabricating the above-discussed acoustic mirror structure. Other features and advantages of the present invention will become more readily apparent to those of ordinary skill in the art after reviewing the following detailed description and accompanying drawings.

DETAILED DESCRIPTION OF THE INVENTION

The present invention is directed to an acoustic mirror structure for a bulk acoustic wave structure and method for fabricating same. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
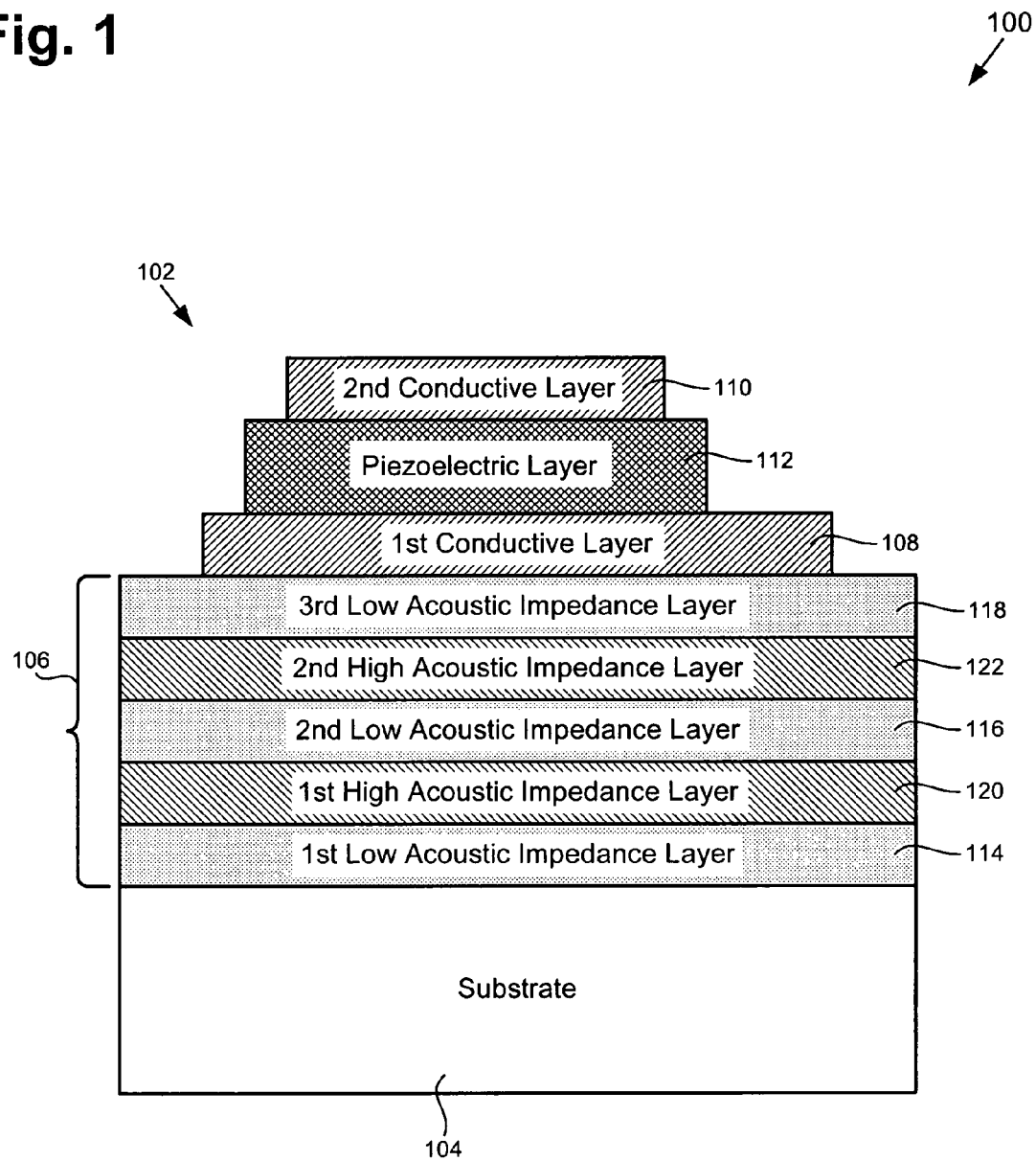
FIG. 1 illustrates a cross-sectional view of an exemplary bulk acoustic wave structure including an exemplary acoustic mirror structure in accordance with one embodiment of the present invention.

FIG. 1 shows a cross-sectional view of a portion of a semiconductor die including an exemplary acoustic mirror in a bulk acoustic wave structure in accordance with one embodiment of the present invention. Certain details and features have been left out of FIG. 1, which are apparent to a person of ordinary skill in the art. As shown in FIG. 1, structure 100 includes bulk acoustic wave structure 102 on substrate 104. Bulk acoustic wave structure 102 further includes acoustic mirror structure 106, conductive layers 108 and 110, and piezoelectric layer 112. Acoustic mirror structure 106 includes low acoustic impedance layers 114, 116, and 118, and high acoustic impedance layers 120 and 122. Thus, in the present embodiment, acoustic mirror structure 106 includes three low acoustic impedance layers and two high acoustic impedance layers. In other embodiments, acoustic mirror structure 106 may included a different number of low acoustic impedance layers and a different number of high acoustic impedance layers to achieve an acoustic mirror structure having a desired level of acoustic reflectivity. Bulk acoustic wave structure 102 can be used as a filter, such as a radio frequency (RF) filter, or as a resonator in a frequency control circuit, for example.

As shown in FIG. 1, low acoustic impedance layer 114, which can comprise silicon dioxide ($SiO_2$) or other suitable low density material, is situated on substrate 104 which can be a silicon substrate. By way of background, acoustic impedance, which refers to the resistance of a material to the passage of sound waves, can be defined as a product of the material's density and acoustic velocity. Since acoustic velocity does not substantially vary in different materials, a material with a higher density generally has higher acoustic impedance compared to a material with a lower density. Thus, by using a low density material to form low acoustic impedance layer 114, low acoustic impedance layer 114 can have correspondingly low acoustic impedance. Low acoustic impedance layer 114 can be formed by depositing a layer of silicon dioxide over substrate 104 by using a chemical vapor deposition (CVD) process or other suitable deposition processes. The thickness of low acoustic impedance layer 114 is dependent on the operating frequency of bulk acoustic wave structure 102. For example, if bulk acoustic wave structure 102 has an operating frequency of approximately 2.0 Gigahertz (GHz), low acoustic impedance layer 114 can have a thickness of between 0.5 micron and 1.0 micron.

Also shown in FIG. 1, high acoustic impedance layer 120 is situated on low acoustic impedance layer 114. In the present embodiment, high acoustic impedance layer 120 can comprise a primary metal and a secondary metal, where the mole percent of the primary metal is substantially greater than the mole percent of the secondary metal. The primary metal can be appropriately selected to achieve a high acoustic impedance layer having a desirably high density, while the secondary metal can be appropriately selected so as to substantially increase the resistivity of the high acoustic impedance layer. Also, the mole percent of the secondary metal can be determined so as to cause a substantial increase in the resistivity of the high acoustic impedance layer while causing only a minimal decrease in the density of the high acoustic impedance layer compared to the resistivity and density of a reference high acoustic impedance layer comprising only the primary metal. In the present embodiment, the primary metal can comprise tungsten (W) and the secondary metal can comprise titanium (Ti).

In other embodiments, the primary metal can comprise a high density metal other than tungsten and/or the secondary metal can comprise a metal other than titanium. High acoustic impedance layer 120 can comprise approximately 70 mole percent of tungsten and approximately 30 mole percent of titanium, for example. The secondary metal can substantially increase the resistivity of high acoustic impedance layer 120 by a factor of approximately five compared to a reference high acoustic impedance layer comprising only the primary metal, for example. In other embodiments, high impedance layer 120 can comprise a composition having a mole percent of titanium that is greater than or less than 30 and a mole percent of tungsten that is less than or greater than 70.

By way of background, the level of acoustic reflectivity at an interface between adjacent layers corresponds to the difference in acoustic impedance between the adjacent layers. For example, level of acoustic reflectivity can be increased at the interface between adjacent layers by increasing the difference in acoustic impedance between the layers. Thus, by controlling the respective densities of low acoustic impedance layer 114 and high acoustic impedance layer 120, a desirably high level of acoustic reflectivity can be achieved at the interface between low acoustic impedance layer 114 and high acoustic impedance layer 120.

In the present embodiment, high acoustic impedance layer 120 can be formed, for example, by depositing a layer comprising tungsten and titanium on low impedance layer 114 by using a target comprising tungsten and titanium in a physical vapor deposition (PVD) process or other suitable deposition process. The thickness of high acoustic impedance layer 120 is dependent on the operating frequency of bulk acoustic wave structure 102. For example, if bulk acoustic wave structure 102 has an operating frequency of approximately 2.0 Gigahertz (GHz), high acoustic impedance layer 120 can have a thickness of between 0.5 micron and 1.0 micron.

In one embodiment, high acoustic impedance layer 120 can comprise a metal such as tungsten or other suitable high density metal and an impurity, such as oxygen, nitrogen, or other suitable impurity. The impurity increases the resistivity of high acoustic impedance layer 120 while only causing a minimal decrease in density of high acoustic impedance layer 120 compared to the resistivity and density of a reference high acoustic impedance layer comprising only a high density metal, such as tungsten. In that embodiment, high acoustic impedance layer 120 can be deposited by adding a small amount of a reactive gas, such as oxygen or nitrogen, as an impurity during a PVD process or other suitable deposition process and using a target comprising a suitable high density metal, such as tungsten. The amount of the reactive gas that is introduced during the deposition process can be appropriately controlled so as to deposit a high acoustic impedance layer having increased resistivity with only a minimal decrease in density compared to the resistivity and density of a reference high acoustic impedance layer comprising a high density metal, such as tungsten, that is deposited in a conventional PVD process without introducing the impurity.

In another embodiment, high acoustic impedance layer 120 can comprise a metal such as tungsten or other suitable high density metal. However, in that embodiment, high acoustic impedance layer 120 can be formed by appropriately adjusting one or more process parameters in a PVD process or other suitable deposition process to form a high acoustic impedance layer comprising a high density metal, such as tungsten, and having increased resistivity compared to the resistivity the high acoustic impedance layer would have if it were deposited in a conventional deposition process using conventional process parameters. In that embodiment, one or more process parameters including deposition power, temperature, and pressure can be appropriately adjusted so as to cause an increase in resistivity of high acoustic impedance layer 120 while causing only a minimal decrease in density of the high acoustic impedance layer. For example, deposition power can be appropriately increased to so as to cause an increase in resistivity of high acoustic impedance layer 120 while causing only a minimal decrease in density of the high acoustic impedance layer.

Further shown in FIG. 1, low acoustic impedance layer 116 is situated on high acoustic impedance layer 120. Low acoustic impedance layer 116 is substantially similar in composition, thickness, and formation to low acoustic impedance layer 114. Also shown in FIG. 1, high acoustic impedance layer 122 is situated on low acoustic impedance layer 116. High acoustic impedance layer 122 is substantially similar in composition, thickness, and formation to high acoustic impedance layer 120. Thus, in the present embodiment, high acoustic impedance layer 122 also comprises a primary metal (e.g. tungsten) and a secondary metal (e.g. titanium), where the secondary metal increases the resistivity of high acoustic impedance layer 122 while only minimally reducing its (i.e. high acoustic impedance layer 122) density compared to the resistivity and density of a reference high acoustic impedance layer comprising only the primary metal. Also shown in FIG. 1, low acoustic impedance layer 118 is situated on high acoustic impedance layer 122. Low acoustic impedance layer 118 is substantially similar in composition, thickness, and formation to low acoustic impedance layer 114 and low acoustic impedance layer 116.

Thus, in the present embodiment, high acoustic impedance layers 120 and 122 in acoustic mirror structure 106 each have a high density, which is primarily determined by an large mole percent of a high density primary metal (e.g. tungsten), and substantially increased resistivity, which is caused by a substantially smaller mole percent of a secondary metal (e.g. titanium).

Also shown in FIG. 1, conductive layer 108 is situated on low acoustic impedance layer 118 and forms a lower electrode of bulk acoustic wave structure 102. Conductive layer 108 can comprise molybdenum or other suitable metal having a high density and sufficiently high conductivity and can be formed by depositing a layer of metal on low acoustic impedance layer 118 by using a PVD process or other suitable deposition processes. Further shown in FIG. 1, piezoelectric layer 112 is situated on conductive layer 108 and can comprise aluminum nitride (AlN), zinc oxide (ZnO), or other suitable piezoelectric material. Piezoelectric layer 112 can be formed, for example, by depositing a layer of aluminum nitride on conductive layer 108 by using a PVD process or other suitable deposition processes. Also shown in FIG. 1, conductive layer 110 is situated on piezoelectric layer 112 and forms an upper electrode of bulk acoustic wave structure 102. Conductive layer 110 can comprise molybdenum or other suitable metal having a high density and sufficiently high conductivity and can be formed by depositing a layer of metal on piezoelectric layer 112 by using a PVD process or other suitable deposition processes.

Thus, by increasing the resistivity of high acoustic impedance layers in the acoustic mirror structure, the present embodiment advantageously causes a reduction in electrical loss in bulk acoustic wave structure 102, which advantageously increases the performance of bulk acoustic wave structure 102. The reduction in electrical loss in bulk acoustic wave structure 102 is caused, in part, by a reduction or elimination of image currents that could be induced in high acoustic impedance layers 120 and 122. However, the reduction in electrical loss in bulk acoustic wave structure 102 is also caused, in part, by reduced acoustic loss in acoustic mirror structure 106, which can be caused, for example, by reduced scattering of acoustic waves at the surfaces of high acoustic impedance layers 120 and 122 if those surfaces are smoother as a result of the compositional change. Alternatively the acoustic viscosity seen by the waves traveling through the high acoustic impedance may be reduced with proper high acoustic impedance layer compositional change.

Figure 2:
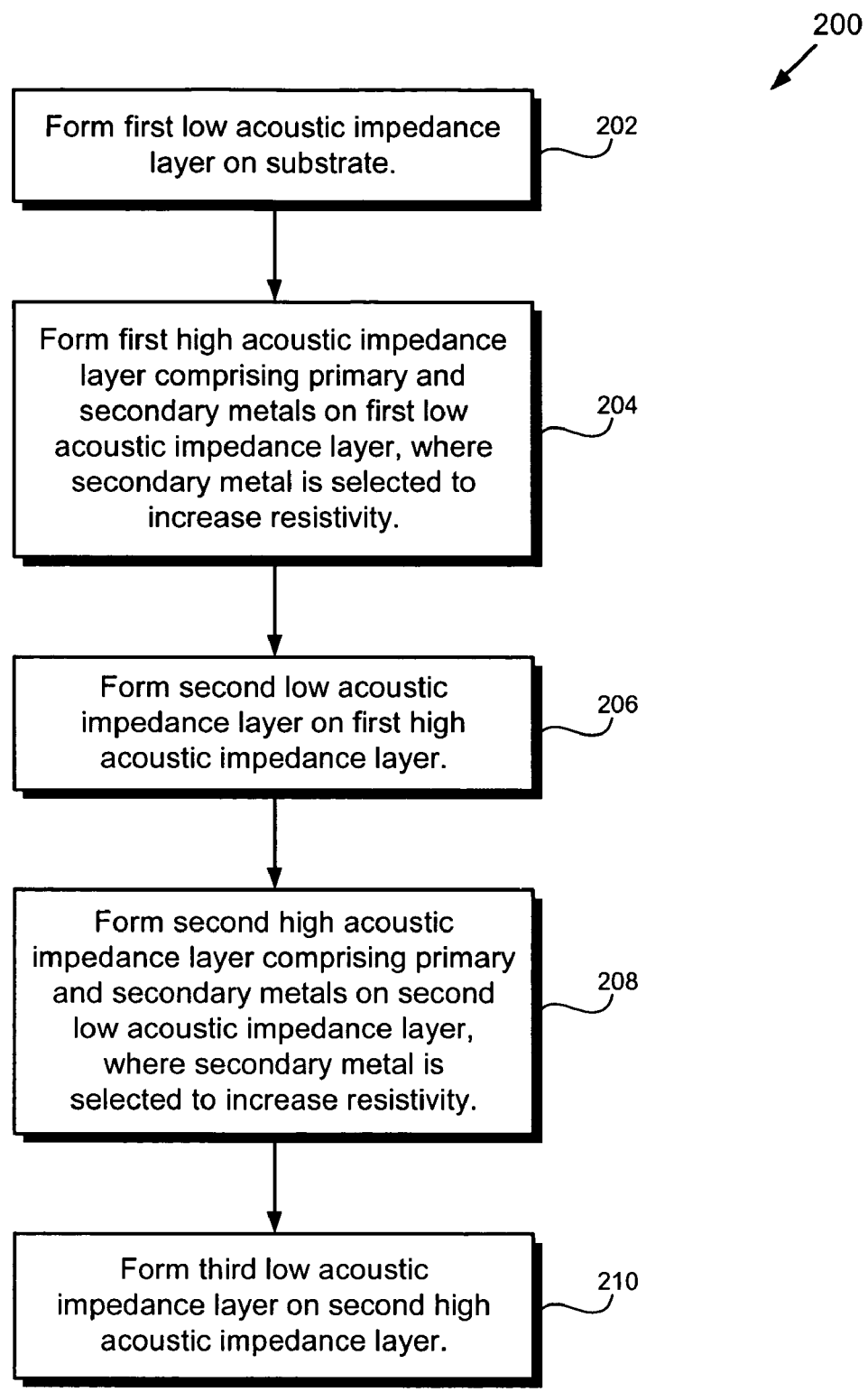
FIG. 2 shows a flowchart illustrating the steps taken to implement one embodiment of the present invention.

FIG. 2 shows flowchart 200, which describes the steps, according to one embodiment of the present invention, of a process by which acoustic mirror structure 106 in bulk acoustic wave structure 102 in FIG. 1 is fabricated. Certain details and features have been left out of flowchart 200 that are apparent to a person of ordinary skill in the art. For example, a step may consist of one or more substeps or may involve specialized equipment or materials, as known in the art. Steps 202 through 210 indicated in flowchart 200 are sufficient to describe one embodiment of the present invention; other embodiments of the invention may utilize steps different from those shown in flowchart 200.

At step 202 of flowchart 200, low acoustic impedance layer 114 is formed on substrate 104 in FIG. 1. Low acoustic impedance layer 114 can comprise silicon dioxide and can be formed on substrate 104 by depositing a layer of silicon dioxide using a CVD process or other suitable processes. At step 204, high acoustic impedance layer 120, which comprises a primary and a secondary metal, is formed on low acoustic impedance layer 114, where the secondary metal is selected to substantially increase the resistivity of high acoustic impedance layer 120 while only minimally decreasing the high acoustic impedance layer's density. The primary metal can be a high density metal such as tungsten, while the secondary metal can be titanium, for example. For example, high acoustic impedance layer 120 can comprise approximately 70 mole percent of tungsten and approximately 30 mole percent of titanium. High acoustic impedance layer 120 can be formed by using a target comprising tungsten and titanium in a PVD process, for example. Thus, high acoustic impedance layer 120 comprises a high density layer having increased resistivity.

At step 206 of flowchart 200, low acoustic impedance layer 116 is formed on high acoustic impedance layer 120. Low acoustic impedance layer 116 is substantially similar in composition, thickness, and formation to low acoustic impedance layer 114. At step 208 of flowchart 200, high acoustic impedance layer 122, which comprises a primary and a secondary metal, is formed on low acoustic impedance layer 116, where the secondary metal is selected to increase the resistivity of high acoustic impedance layer 122 while only minimally decreasing the high acoustic impedance layer's density. High acoustic impedance layer 122 is substantially similar in composition, thickness, and formation to high acoustic impedance layer 120. Thus, high acoustic impedance layer 122 also comprises a high density layer having substantially increased resistivity. At step 210 of flowchart 200, low acoustic impedance layer 118 is formed on high acoustic impedance layer 122 to complete formation of acoustic mirror structure 106. Low acoustic impedance layer 118 is substantially similar in composition, thickness, and formation to low acoustic impedance layers 114 and 116.

Figure 3:
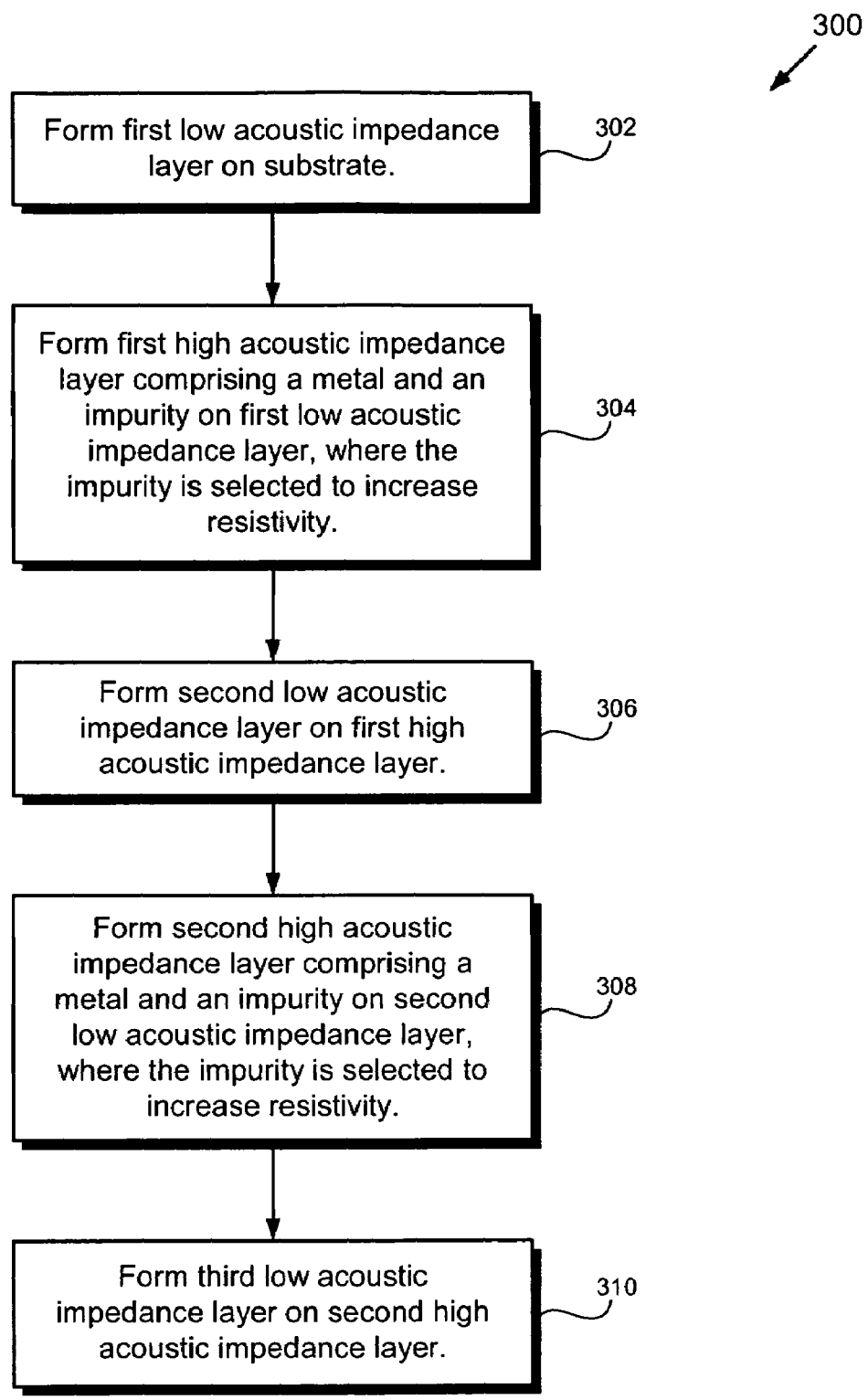
FIG. 3 shows a flowchart illustrating the steps taken to implement one embodiment of the present invention.

FIG. 3 shows flowchart 300, which describes the steps, according to one embodiment of the present invention, of a process by which acoustic mirror structure 106 in bulk acoustic wave structure 102 in FIG. 1 is fabricated. Certain details and features have been left out of flowchart 300 that are apparent to a person of ordinary skill in the art. For example, a step may consist of one or more substeps or may involve specialized equipment or materials, as known in the art. Steps 302 through 310 indicated in flowchart 300 are sufficient to describe one embodiment of the present invention; other embodiments of the invention may utilize steps different from those shown in flowchart 300.

At step 302 of flowchart 300, low acoustic impedance layer 114 is formed on substrate 104 in FIG. 1. Low acoustic impedance layer 114 can comprise silicon dioxide and can be formed on substrate 104 by depositing a layer of silicon dioxide using a CVD process or other suitable processes. At step 304, high acoustic impedance layer 120, which comprises a metal and an impurity in the embodiment in FIG. 3, is formed on low acoustic impedance layer 114, where the impurity is selected to increase resistivity while only minimally decreasing density of high acoustic impedance layer 120. The metal can be a high density metal such as tungsten, while the impurity can be a reactive gas such as oxygen or nitrogen. In the embodiment in FIG. 3, high acoustic impedance layer 120 can be formed by depositing a high density metal such as tungsten using a PVD process, where a small amount of a reactive gas, such as oxygen or nitrogen, is added as an impurity during the PVD process. The amount of reactive gas that is introduced during the deposition process is appropriately controlled to achieve a high acoustic impedance layer having increased resistance with only a minimal decrease in density.

At step 306 of flowchart 300, low acoustic impedance layer 116 is formed on high acoustic impedance layer 120. Low acoustic impedance layer 116 is substantially similar in composition, thickness, and formation to low acoustic impedance layer 114. At step 308 of flowchart 300, high acoustic impedance layer 122, which comprises a metal and an impurity in the embodiment in FIG. 3, is formed on low acoustic impedance layer 114, where the impurity is selected to increase resistivity while only minimally decreasing density of the high acoustic impedance layer. High acoustic impedance layer 122 is substantially similar in composition, thickness, and formation to high acoustic impedance layer 120. Thus, high acoustic impedance layer 122 also comprises a high density layer having increased resistivity. At step 310 of flowchart 300, low acoustic impedance layer 118 is formed on high acoustic impedance layer 122 to complete formation of acoustic mirror structure 106. Low acoustic impedance layer 118 is substantially similar in composition, thickness, and formation to low acoustic impedance layers 114 and 116.

Thus, as described above, the present invention achieves an acoustic mirror structure in a bulk acoustic wave structure, where the acoustic mirror structure includes high acoustic impedance layers having increased resistivity and high density. By providing an acoustic mirror structure with high acoustic impedance layers having increased resistivity and high density, the invention's acoustic mirror structure advantageously reduces electrical loss in the bulk acoustic wave structure. As a result, the invention's acoustic mirror structure advantageously increases performance of the bulk acoustic wave structure.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, an acoustic mirror structure for a bulk acoustic wave structure and method for fabricating same have been described.

The invention claimed is:

1. An acoustic mirror structure situated in a bulk acoustic wave structure, said acoustic mirror structure comprising:
   a plurality of alternating low acoustic impedance and high acoustic impedance layers situated on a substrate;
   wherein at least one of said high acoustic impedance layers comprises a first mole percent of a primary metal and a second mole percent of a secondary metal, wherein said first mole percent of said primary metal is greater than said second mole percent of said secondary metal, wherein said secondary metal causes said at least one of said high acoustic impedance layers to have increased resistivity.

2. The acoustic mirror structure of claim 1 wherein said second mole percent of said secondary metal does not cause a substantial decrease in density of said at least one of said acoustic impedance layers.

3. The acoustic mirror structure of claim 1 wherein said increased resistivity of said at least one of said high acoustic impedance layers causes a reduction in electrical loss in said bulk acoustic wave structure.

4. The acoustic mirror structure of claim 1 wherein said primary metal comprises tungsten.

5. The acoustic mirror structure of claim 1 wherein said secondary metal comprises titanium.

6. The acoustic mirror structure of claim 5 wherein said first mole percent is approximately 70 mole percent and said second mole percent is approximately 30 mole percent.

7. The acoustic mirror structure of claim 5 wherein said secondary metal increases said resistivity of said at least one of said high acoustic impedance layers by a factor of approximately five.

8. The acoustic mirror structure of claim 1 wherein said plurality of alternating low acoustic impedance and high acoustic impedance layers comprise at least two high acoustic impedance layers.

9. An acoustic mirror structure comprising:
   a plurality of low acoustic impedance and high acoustic impedance layers situated on a substrate;
   wherein at least one of said high acoustic impedance layers comprises a first mole percent of a primary metal and a second mole percent of a secondary metal, wherein said secondary metal causes said at least one of said high acoustic impedance layers to have increased resistivity.

10. The acoustic mirror structure of claim 9 wherein said second mole percent of said secondary metal does not cause a substantial decrease in density of at least one of said plurality of acoustic impedance layers.

11. The acoustic mirror structure of claim 9 wherein said increased resistivity of said at least one of said high acoustic impedance layers causes a reduction in electrical loss.

12. The acoustic mirror structure of claim 9 wherein said primary metal comprises tungsten.

13. The acoustic mirror structure of claim 9 wherein said secondary metal comprises titanium.

14. The acoustic mirror structure of claim 9 wherein said first mole percent is approximately 70 mole percent and said second mole percent is approximately 30 mole percent.

15. The acoustic mirror structure of claim 9 wherein said secondary metal increases said resistivity of said at least one of said high acoustic impedance layers by a factor of approximately five.

16. An acoustic mirror structure situated in a bulk acoustic wave structure, said acoustic mirror structure comprising:
   a plurality of alternating low acoustic impedance and high acoustic impedance layers situated on a substrate,
   wherein at least one of said high acoustic impedance layers comprises a primary metal and a secondary metal, wherein said secondary metal causes said at least one of said high acoustic impedance layers to have increased resistivity.

17. The acoustic mirror structure of claim 16 wherein said secondary metal does not cause a substantial decrease in density of said at least one of said acoustic impedance layers.

18. The acoustic mirror structure of claim 16 wherein said increased resistivity of said at least one of said high acoustic impedance layers causes a reduction in electrical loss in said bulk acoustic wave structure.

19. The acoustic mirror structure of claim 16 wherein said primary metal comprises tungsten.

20. The acoustic mirror structure of claim 19 wherein said secondary metal comprises titanium.

21. The acoustic mirror structure of claim 16 wherein a first mole percent of said primary metal is approximately 70 mole percent and a second mole percent of said secondary metal is approximately 30 mole percent.

22. The acoustic mirror structure of claim 16 wherein said secondary metal increases said resistivity of said at least one of said high acoustic impedance layers by a factor of approximately five.

23. The acoustic mirror structure of claim 16 wherein said plurality of alternating low acoustic impedance and high acoustic impedance layers comprise at least two high acoustic impedance layers.

* * * * *